United States Patent [19]
Yoo

[11] Patent Number: 5,268,244
[45] Date of Patent: Dec. 7, 1993

[54] SELF-ALIGNED PHASE SHIFTER FORMATION

[75] Inventor: Chue-San Yoo, Taipei, Taiwan

[73] Assignee: Taiwan Semiconductor Manufacturing Company, Taiwan

[21] Appl. No.: 929,125

[22] Filed: Aug. 13, 1992

[51] Int. Cl.⁵ .............................................. G03F 9/00
[52] U.S. Cl. ........................................ 430/5; 156/653
[58] Field of Search ............................ 430/5; 156/653

[56] References Cited
U.S. PATENT DOCUMENTS
5,045,417  9/1991  Okamoto .................................. 430/5

Primary Examiner—Marion E. McCamish
Assistant Examiner—Mark A. Chapman
Attorney, Agent, or Firm—George O. Saile

[57] ABSTRACT

The process of fabricating the phase-shifting photomask includes forming on a substrate a patterned metal layer having vertical and horizontal surfaces. A substantially uniform phase-shifting material is deposited over the patterned metal layer surfaces. The phase-shifting material anisotropically etched to substantially remove the material from the horizontal surfaces and to substantially leave in place the material on the vertical or sidewall surfaces of metal layer to form phase shifter sidewall structures on the vertical or sidewall surfaces to form the phase shifting photomask without use of photoresist lithography in the formation of the phase shifter sidewall structures.

15 Claims, 4 Drawing Sheets

SELF-ALIGNED PHASE SHIFTER FORMATION

BACKGROUND OF THE INVENTION

(1) Field of the Invention

The invention relates to a process for fabricating a photomask, and more particularly, to a process for fabricating a self-aligning, phase-shifting photomask.

(2) Description of the Prior Art

As optical lithography advances to 0.5 to 0.35 microns and below, new technologies are required to increase resolution of the imaging lens. One new technology is the use of phase-shifting photomasks. In their paper, "Conjugate Twin-Shifter for the New Phase-Shift Method to High Resolution Lithography," (H. Ohtsuka, K. Abe, T. Onodera, K. Kuwahara, paper #1463-08, SPIE Conference, 1991), Ohtsuka et al state that resolution can be improved up to 60% using phase shifting techniques with existing lenses and resist materials. Toh et al ("Optical Lithography with Chromeless Phase-Shifted Masks," Kenny K. H. Toh, Giang Dao, Rajeev Singh, Henry Gaw, paper #1463-06, SPIE Conference, 1991) define the basic principle of phase shifting. A transparent coating of thickness $d = 0.5 L/(n-1)$ (L = wavelength, n = index of refraction) is plcaed over a transparent area. The electric field passing through the coated region is delayed 180° out of phase with the electric field through the uncoated region. The electric field at the center of a large phase-shifted area will be equal in magnitude, but opposite in sign from the electric field passing through a clear area. Also, at the edge of a phase-shifted area, the electric fields from the phase-shifted and clear areas will cancel out producing a strong electric field null and intensity null at that location. These interactions produce a sharper image at the wafer.

In his paper, "Phase-Shifting and Other Challenges in Optical Mask Technology," (short course on phase-shift mask technology, SPIE Conference, 1991) Burn J. Lin discusses a variety of phase-shifting techniques, including alternate phase shifting in which every other element in a closely packed array is phase-shifted, sub-resolution phase shifting which serves to enhance the edge contrast of patterns below the resolution limit of the given optical system, rim phase shifting in which phase shifting takes place solely at the rim of the patterns, and others. Lin tested the various types of phase shifting on five different feature patterns. All five features patterns were improved by rim phase shifting.

U.S. Pat. No. 4,902,899 to Burn J. Lin describes subresolution halftone incorporated within mask patterns for controlling the transmittance of actinic light exposure area for quality improvement. A process for fabricating an ordinary transmission mask into a rim phase-shifting mask incorporating exposure, development, and etch steps is described in the paper "New Phase Shifting Mask with Self-Aligned Phase Shifters for a Quarter Micron Photolithography," (Akihiro Nitayama, Takashi Sato, Kohji Hashimoto, Fumiaki Shigemitsu, and Makoto Nakase, IEDM Technical Digest, pp. 57-60, 1989). A similar resulting undercut mask feature is shown in U.S. Pat. No. 4,696,877 to Matsui et al. U.S. Pat. No. 4,707,218 to Giammarco et al describes the formation of sidewall structures to reduce the dimension of a formed opening in a semiconductor manufacturing method.

Phase-shifting masks offer significant improvement in resolution, especially for submicron feature sizes. Known methods of fabricating phase-shifting masks are complicated, requiring possibly multiple photoresist steps in the fabrication of the mask.

SUMMARY OF THE INVENTION

A principle object of the present invention is to provide an effective and very manufacturable process for fabricating a phase-shifting photomask.

Another object of the present invention is to provide a process of fabricating a phase-shifting photomask that does not require photoresist steps.

Another object of the present invention is to provide a process of fabricating a phase-shifting photomask that is self-aligning.

In accordance with the objects of this invention a new process for fabricating a phase-shifting photomask is achieved. The result of the present invention is a phase-shifting photomask of the rim phase shifter type, in that the phase shifter exists on the edges of the feature patterns.

The process of fabricating the phase-shifting photomask includes forming on a substrate a patterned metal layer having vertical and horizontal surfaces. A substantially uniform phase-shifting material is deposited over the patterned metal layer surfaces. The phase-shifting material anisotropically etched to substantially remove the material from the horizontal surfaces and to substantially leave in place the material on the vertical or sidewall surfaces of metal layer to form phase shifter sidewall structures on the vertical or sidewall surfaces to form the phase shifting photomask without use of photoresist lithography in the formation of the phase shifter sidewall structures. The vertical phase shifter dimension is between about 500 to 4000 Angstroms and the horizontal phase shifter dimension is between about 500 to 4000 Angstroms.

BRIEF DESCRIPTION OF THE DRAWINGS

In the accompanying drawings forming a material part of this description, there is shown.

DESCRIPTION OF THE PREFERRED EMBODIMENTS

The first portion of this discussion will refer to the Prior Art FIGS. 1a through 1c, 2a, and 2b. The typical process of forming a rim phase-shifting mask will be described followed by the description of a typical process of forming an alternating phase-shifting mask.

Figure 1A:
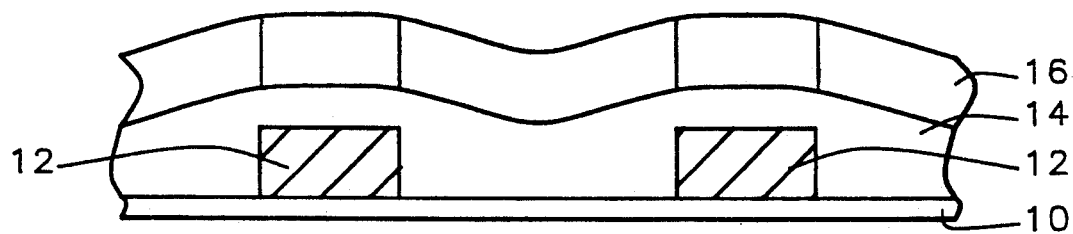
FIGS. 1a through 1c schematically illustrate in cross-sectional representation the fabrication of a prior art rim phase-shifting mask.
Figure 1B:
Figure 1C:
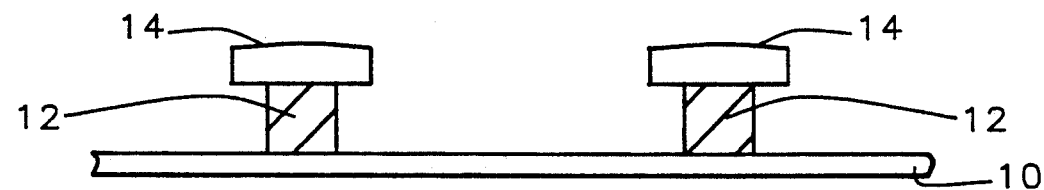

Referring now more particularly to FIG. 1a, there is shown a substrate 10 composed of quartz or glass on which is a patterned layer of chromium 12. A shifter film 14 is deposited on top of the patterned chromium layer 12. A photoresist layer 16 (latent image shown in FIG. 1A) is placed on top of the shifter layer 14. The mask is flipped over to be exposed from the back (self-aligned imaging), then developed to result in FIG. 1b. A wet etch is performed on the mask to result in FIG. 1c. The chromium layer 12 has been undercut. Layer 14 comprises the rim phase shifters. Such a method is described in the above cited article, "New Phase Shifting Mask with Self-aligned Phase Shifters for a Quarter Micron Photolithography," by Nitayama et al.

Figure 2A:
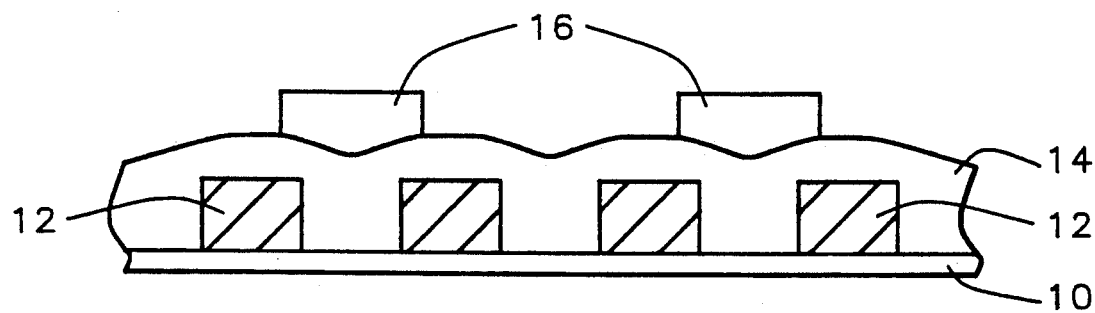
FIGS. 2a and 2b schematically illustrate in cross-sectional representation the fabrication of a prior art alternating phase-shifting mask.
Figure 2B:
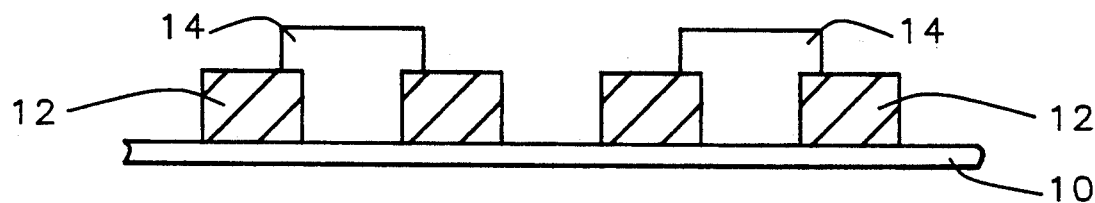

Referring now to FIG. 2a, there is shown a substrate 10 composed of quartz or the like on which is a patterned layer of chromium 12. A shifter film 14 is deposited on top of the patterned chromium layer 12. A photoresist layer 16 is placed on top of the shifter layer 14. A second mask is applied and exposed, plus ensuing photolithography steps. The shifter layer is etched to produce the alternating phase shifter 14 shown in FIG. 2b. This method is attributed to Levenson (IBM) in the above cited article, "Phase-Shifting and Other Challenges," by Burn J. Lin.

While the photomasks produced by the two preceding methods improve optical resolution, their methods of fabrication are complicated, requiring photolithography steps in the fabrication of the photomasks. The present invention requires no photolithography steps in fabricating the photomasks, yet produces a rim phase-shifting mask with improved optical resolution. The method of the present invention will be described, as follows.

Figure 3:
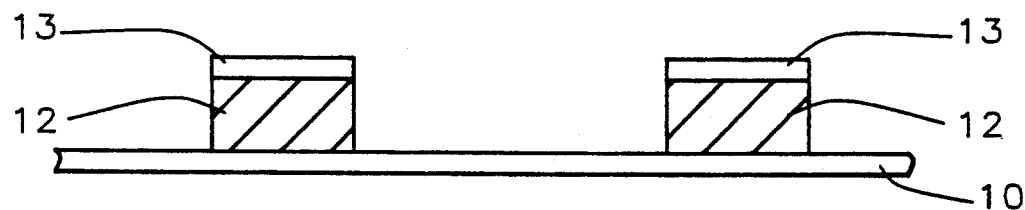
FIGS. 3 through 5 schematically illustrate in cross-sectional representation one preferred embodiment of this invention.

Referring now to FIG. 3, there is shown an illustration of a partially completed photomask. The substrate 10 is a quartz plate. A layer of chromium 12 has been deposited, for example, by chemical vapor deposition, on the substrate 10 to a operable thickness of 800 to 1500 Angstroms or preferred thickness of 800 to 1200 Angstroms. An oxide layer 13 has been deposited by spincoating on top of the chromium layer 12 to a thickness of between 100 to 200 Angstroms. This oxide layer acts to reduce the reflectivity of the chromium layer. The combined thickness of the chromium and oxide layers 12 and 13 determine the shifting angle. To achieve the desired shifting angle of 180°, the combined thickness of layers 12 and 13 should be 800 to 2000 Angstroms. The photomask is patterned using resist, exposure with E-beam, development, and conventional etching.

Figure 4:
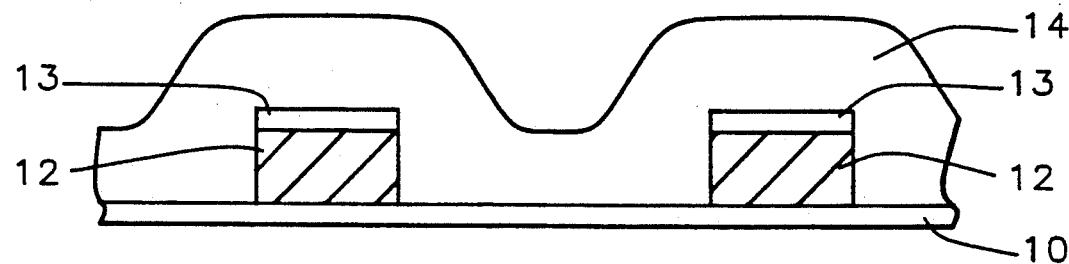

Referring now to FIG. 4, the shifter material layer 14 is deposited. The shifter material is silicon oxide, silicon nitride, or other light-transparent material. This material is deposited by Chemical Vapor Deposition or Plasma Enhanced Chemical Vapor Deposition according to the process and conditions: the needed thickness (d) of the shifter layer 14 depends on the exposing wavelength (L) and refractive index of the film (n).

$$\text{The phase shift} = \frac{2(pi)d}{L}(n-1)$$

Therefor, the needed thickness (d) of said shifter material is equal to $0.5 L/(n-1)$. It is important that this layer is uniform in thickness. The layer is preferably between about 300 to 1000 Angstroms for future integrated circuit processing. The thickness of the shifter layer 14 affects the contrast of the resulting pattern on the wafer. The optimum shifter thickness is a function of the chromium thickness and the etching conditions. The shifter width is determined by the as-deposited dielectric thickness and shifter etching conditions. The shifter thickness and width can be optimized for each specific operating system with a specific wavelength, shifter refractive index, etc.

Figure 5:
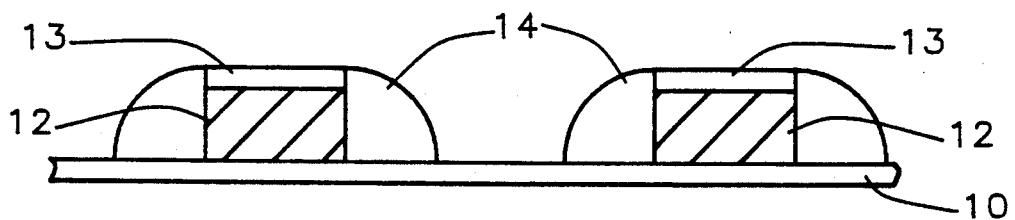

Referring now to FIG. 5, the shifter material layer is anisotropically plasma etched leaving sidewalls 14 as the rim phase shifters. The etching conditions are similar to those for dielectrics used in typical integrated circuit fabrication. That is, 5–20 sccm $CF_4$, 10–30 sccm $CHF_3$, 300–600 sccm Ar, at a pressure of 600–900 mTorr, power of 300–500 watts, and an electrode gap of 0.5–1.0 cm. In general, the thicker the as-deposited oxide, the wider the spacer width. Less ion bombardment (i.e., higher pressure, lower power, or larger gap) results in a more rectangular spacer shape.

Figure 6:
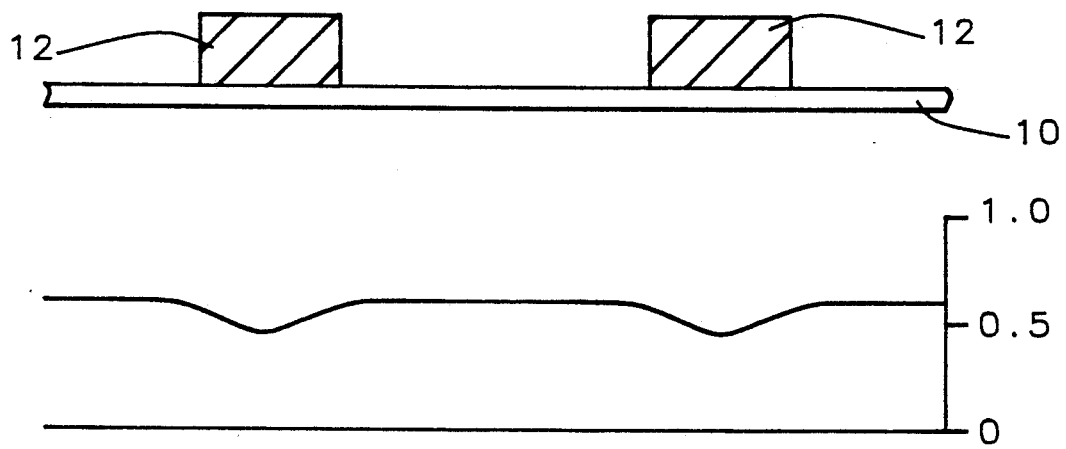
FIG. 6 schematically illustrates in cross-sectional representation a prior art conventional mask and the intensity of light projected onto the wafer.
Figure 7:
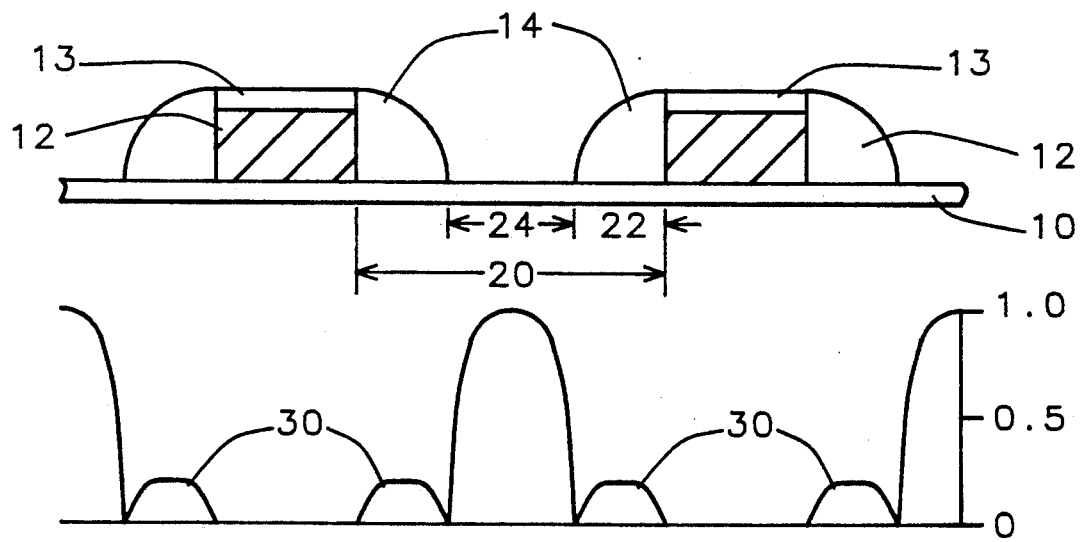
FIG. 7 schematically illustrates in cross-sectional representation one preferred embodiment of this invention and the intensity of light projected onto the wafer.

Referring now to FIG. 6, there is illustrated a conventional prior art photomask without phase shifters. The wave pattern shown represents the intensity of the light passing through the photomask onto the wafer. Referring now to FIG. 7, there is shown the phase-shifting photomask of the present invention along with the wave pattern representing the intensity of light passing through the photomask onto the wafer. As can be seen, the intensity contrast of light on the wafer is improved using the phase-shifting mask of this invention than it is using a conventional non phase-shifting mask. Note that the energy indicated by number 30 on FIG. 7, corresponding to the phase-shifting sidewall structures is lower than sub-threshold energy; no latent image is formed.

The phase shifter mask is operative to light with defraction phenomena such as ultraviolet, deep ultraviolet, G-Line (436 nanometers), I-Line (365 nanometers) and the like.

The following Examples are given to show the important features of the invention and to aid in the understanding thereof and variations may be made by one skilled in the art without departing from the spirit and scope of the invention.

EXAMPLES

The dimension of the shifter width can be optimized for different systems, i.e., wavelength, chrome space, refractive index of shifter, etc.

EXAMPLE 1

For example, for a g-line system with silicon dioxide spacer, for a 0.8 um space, a 0.24 um shifter is used to improve the light intensity modulation. The following table depicts the maximum intensity achieved with various shifter widths.

TABLE 1

| Nominal space width on wafer | Shifter width/Maximum intensity | | | |
|---|---|---|---|---|
| 0.8 um | 0/100% | 0.08/97% | 0.16/100% | 0.2/108% |

Figure 8:
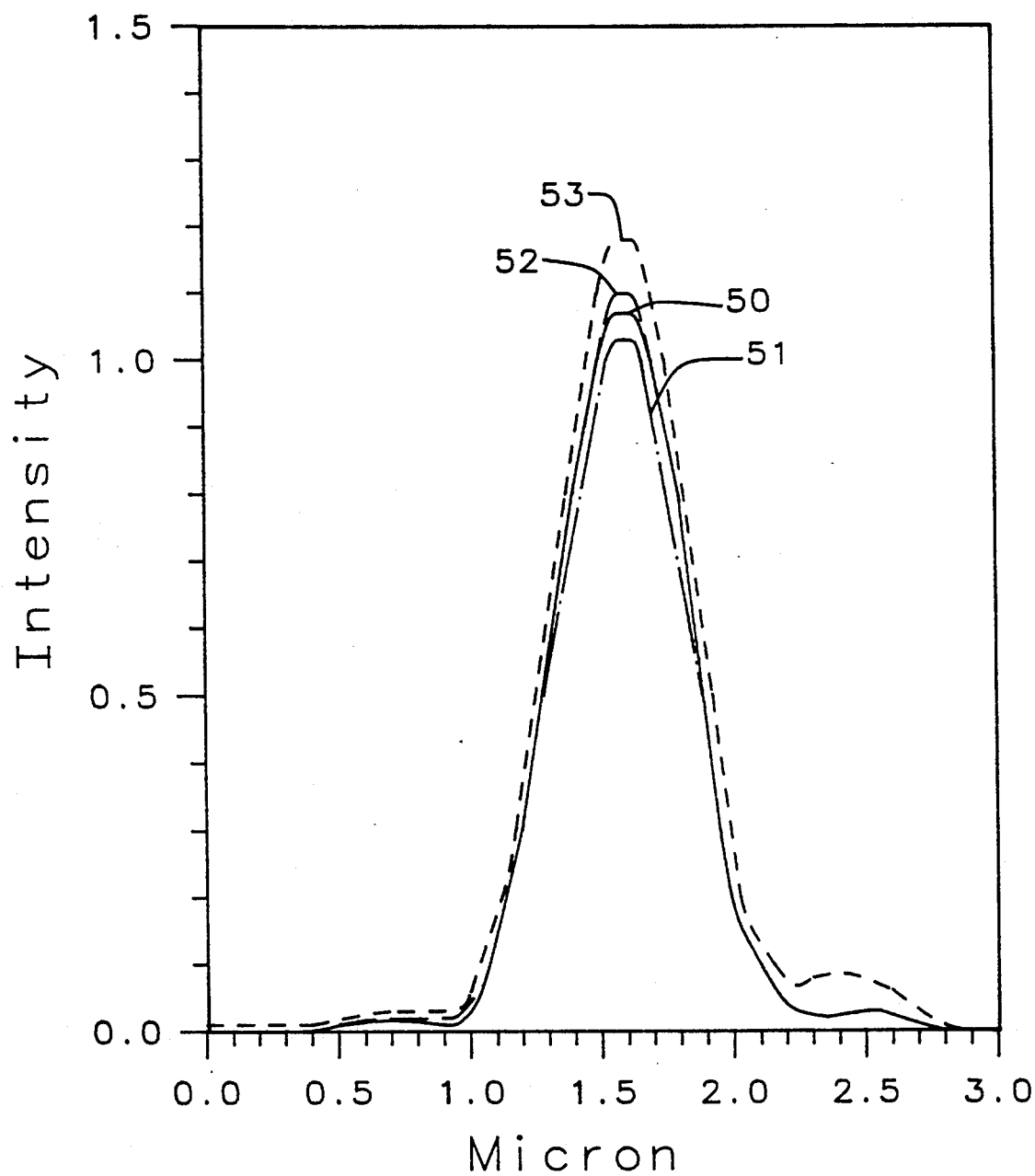
FIG. 8 graphically illustrates the light intensity achieved by using rim phase shifters of various widths.

FIG. 8 graphically illustrates the light intensity achieved with the shifter width values given in Table 1 for a nominal space width on a wafer of 0.8 um, using a g-line stepper. Line 50 depicts the light intensity achieved when no shifter is used. Line 51 illustrates the light intensity achieved using a shifter width of 0.08 um. Line 52 illustrates the light intensity achieved using a shifter width of 0.16 um. Line 53 depicts the light intensity achieved using a shifter width of 0.24 um.

The optimal shifter width for the example above is 0.2 to 0.3 um. Below that width, the shifter effect is lost while above that width, the improvement levels off.

EXAMPLE 2

The following table depicts the present best design for shifter width for various desired nominal space widths on the wafer.

TABLE 2

| Nominal space width on wafer | Shifter width |
| --- | --- |
| 1.0 um | No shifter |
| 0.8 um | 0.2 to 0.3 um |
| 0.6 um | 0.15 to 0.25 um |
| 0.4 um | 0.1 to 0.15 um |

Note that the distance "A" (defined as the distance between two shifters) is always kept constant as the shifter width increases. The nominal space width on the wafer is illustrated as width 20 in FIG. 7. The spacer width is denoted by 22 and the distance "A" is denoted by 24 in FIG. 7.

While the invention has been particularly shown and described with reference to the preferred embodiments thereof, it will be understood by those skilled in the art that various changes in form and details may be made without departing from the spirit and scope of the invention.

What is claimed is:

1. The process of fabricating a self-aligned phase-shifting photomask having a phase shifter sidewall structure with a thickness and a width dimension comprising:
    forming on a substrate a patterned metal layer having vertical and horizontal surfaces;
    wherein said thickness dimension (d) is determined by the height of said patterned metal layer and is equal to $0.5 L/(n-1)$ where L is the wavelength and n is the refractive index of material of said shifter sidewall structure;
    depositing a substantially uniform thickness layer of phase-shifting material over said patterned metal layer surfaces wherein said width dimension is determined from said uniform thickness layer; and
    anisotropically etching said phase-shifting material to substantially remove said material from said horizontal surfaces and to substantially leave in place said material on said vertical surfaces of said metal layer to form phase shifter sidewall structures on said vertical surfaces to form said self-aligned phase shifting photomask.

2. The process of claim 1 wherein said substrate is quartz.

3. The process of claim 1 wherein said metal layer is composed of chromium and chromium oxide.

4. The process of claim 3 wherein said chromium layer is between 800 and 1200 Angstroms thick.

5. The process of claim 3 wherein said chromium oxide layer is between 100 to 200 Angstroms thick.

6. The process of claim 1 wherein the thickness of said metal layer determines the shifting angle.

7. The process of claim 1 wherein the thickness of said metal layer is between 800 to 1500 Angstroms.

8. The process of claim 1 wherein said shifter material is silicon oxide having a deposited thickness of between about 300 to 1000 Angstroms.

9. The process of claim 1 wherein said shifter material is silicon nitride having a deposited thickness of between about 300 to 1000 Angstroms.

10. The process of claim 1 wherein the thickness of said shifter material is chosen so that it will be able to shift light by 180° of phase angle.

11. The process of claim 1 wherein the etch back conditions are 300–500 watts, 600–900 mTorr, 5–20 sccm $CF_4$, 10–30 sccm $CHF_3$, 300–600 sccm Ar, 0.5–1.0 cm electrode gap.

12. A projection printing phase shifter mask manufactured by the process of claim 1 wherein said patterned metal layer is chromium, said phase shifter material is an inorganic transparent and further comprising a chromium oxide layer on said chromium layer.

13. The mask of claim 12 wherein said phase shifter mask has a phase shifter material that is composed of silicon oxide.

14. The mask of claim 12 wherein said phase shifter mask has a phase shifter material that is composed of silicon nitride.

15. The mask of claim 12 wherein the vertical phase shifter dimension is between about 500 to 4000 Angstroms and the horizonal phase shifter dimension is between about 500 to 4000 Angstroms.

* * * * *